(12) United States Patent
Hollis

(10) Patent No.: US 8,953,364 B2
(45) Date of Patent: Feb. 10, 2015

(54) VOLTAGE RAIL NOISE SENSING CIRCUIT AND METHOD

(71) Applicant: Timothy M. Hollis, Meridian, ID (US)

(72) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 13/622,016

(22) Filed: Sep. 18, 2012

(65) Prior Publication Data

US 2014/0078815 A1 Mar. 20, 2014

(51) Int. Cl.
*G11C 11/24* (2006.01)
*G11C 11/404* (2006.01)

(52) U.S. Cl.
CPC ................... *G11C 11/404* (2013.01)
USPC ...... 365/149; 365/189.11; 365/207; 365/196; 365/208; 365/212

(58) Field of Classification Search
CPC .. G01R 1/3004; G01R 31/40; G01R 19/0092; G01R 1/203; G11C 11/5642
USPC ............. 365/189.11, 207, 196, 205, 208, 212
See application file for complete search history.

(56) References Cited

U.S. PATENT DOCUMENTS

| | | | |
|---|---|---|---|
| 6,823,293 B2 | 11/2004 | Chen et al. | |
| 7,332,916 B2 | 2/2008 | Nagata | |
| 7,365,548 B2 | 4/2008 | Neuman | |
| 7,443,187 B2 | 10/2008 | Jenkins et al. | |
| 7,667,477 B2 | 2/2010 | Nagata | |
| 2002/0196048 A1* | 12/2002 | Sunter | 324/771 |
| 2008/0036477 A1* | 2/2008 | Jenkins et al. | 324/713 |
| 2011/0193589 A1 | 8/2011 | Chua-Eoan et al. | |

FOREIGN PATENT DOCUMENTS

JP 11330358 11/1999

OTHER PUBLICATIONS

Alon, et al.; Circuits and Techniques for High-Resolution Measurement of On-Chip Power Supply Noise, IEEE Journal of Solid-State Circuits; vol. 40, No. 4; Apr. 2005, Institute of Electrical and Electronics Engineers.

Nagata, et al.; A Built-in Technique for Probing Power Supply and Ground Noise Distribution Within Large-Scale Digital Integrated Circuits; IEEE Journal of Solid-State Circuits; vol. 40, No. 4; Apr. 2005, Institute of Electrical and Electronics Engineers.

New Japan Radio Co., Ltd.; Datasheets for Electronic Components; [online]; Downloaded from the Internet <URL: http://www.datasheetcatalog.org/datasheets/480/455332_DS.pdf>. Downloaded on Aug. 7, 2012.

* cited by examiner

*Primary Examiner* — Thong Q Le
(74) *Attorney, Agent, or Firm* — Knobbe Martens Olson & Bear LLP

(57) ABSTRACT

Apparatus and methods level shift a direct current (DC) component of a voltage rail signal from a first DC level to a second DC level such that voltage rail noise can be determined. The actual voltage rail noise can be compared to an expected amount of noise for analysis and validation of simulation models. Such assessment can be used to validate simulation models used to refine a design of an integrated circuit or as part of built-in self test.

49 Claims, 13 Drawing Sheets

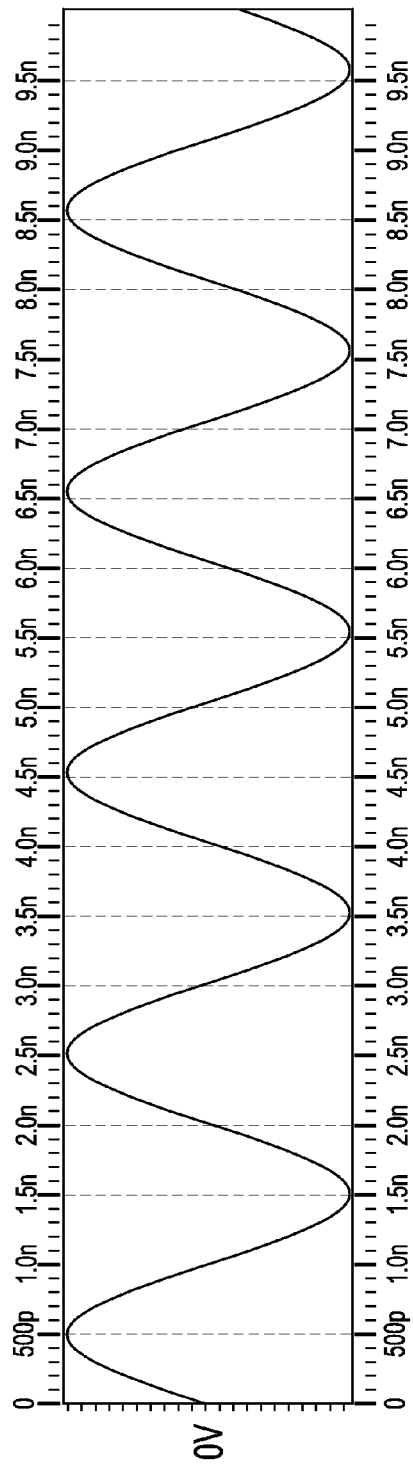
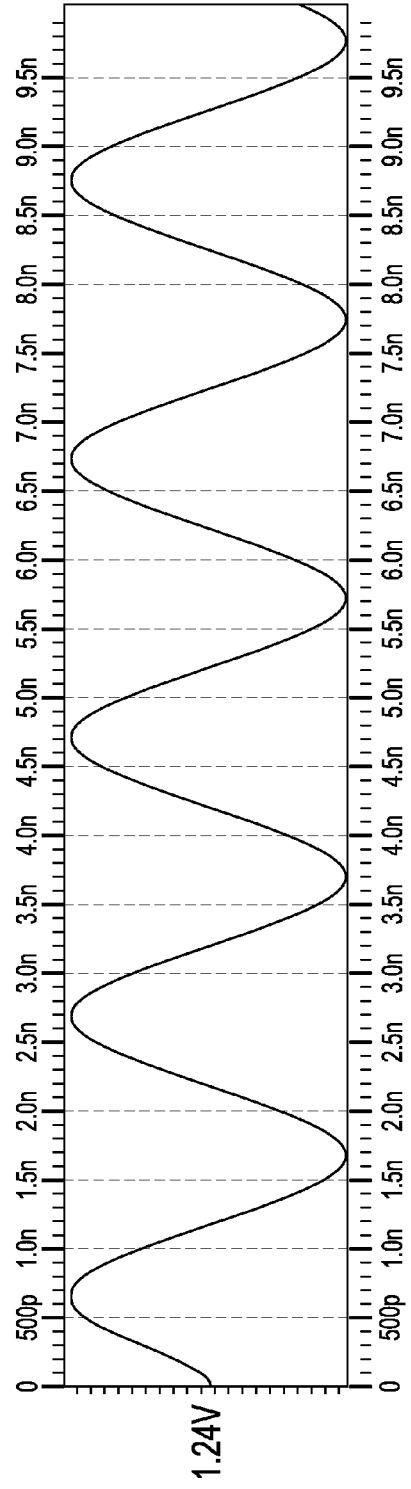
FIG. 8A
FIG. 8B though noise on the voltage rails can affect performance. Since the noise is internal to the IC, the noise can be difficult to observe from outside the IC with test equipment.

VOLTAGE RAIL NOISE SENSING CIRCUIT AND METHOD

BACKGROUND

1. Field of the Invention

Embodiments of the invention generally relate to integrated circuit electronics, and in particular, to the analysis of one or more internal voltage rails for noise.

2. Description of the Related Art

Power is typically distributed in an integrated circuit (IC) using voltage rails. For example, an IC can use a VDD power rail and a VSS ground rail. However, an IC can have more than two voltage rails for power.

Dynamic noise can occur during operation. For example, the switching of digital circuits can induce noise on the voltage rails. This noise can interfere with the operation of the IC. As integrated circuits become smaller, higher performance, and/or voltage levels for the voltage rails are lowered, noise on the voltage rails can affect performance. Since the noise is internal to the IC, the noise can be difficult to observe from outside the IC with test equipment.

BRIEF DESCRIPTION OF THE DRAWINGS

These drawings and the associated description herein are provided to illustrate specific embodiments of the invention and are not intended to be limiting.

FIGS. 8A and 8B are graphs illustrating operation of the voltage level shifter of FIG. 7;

In this description, reference is made to the drawings in which like reference numerals indicate identical or functionally similar elements.

DETAILED DESCRIPTION OF SPECIFIC EMBODIMENTS

Figure 1:
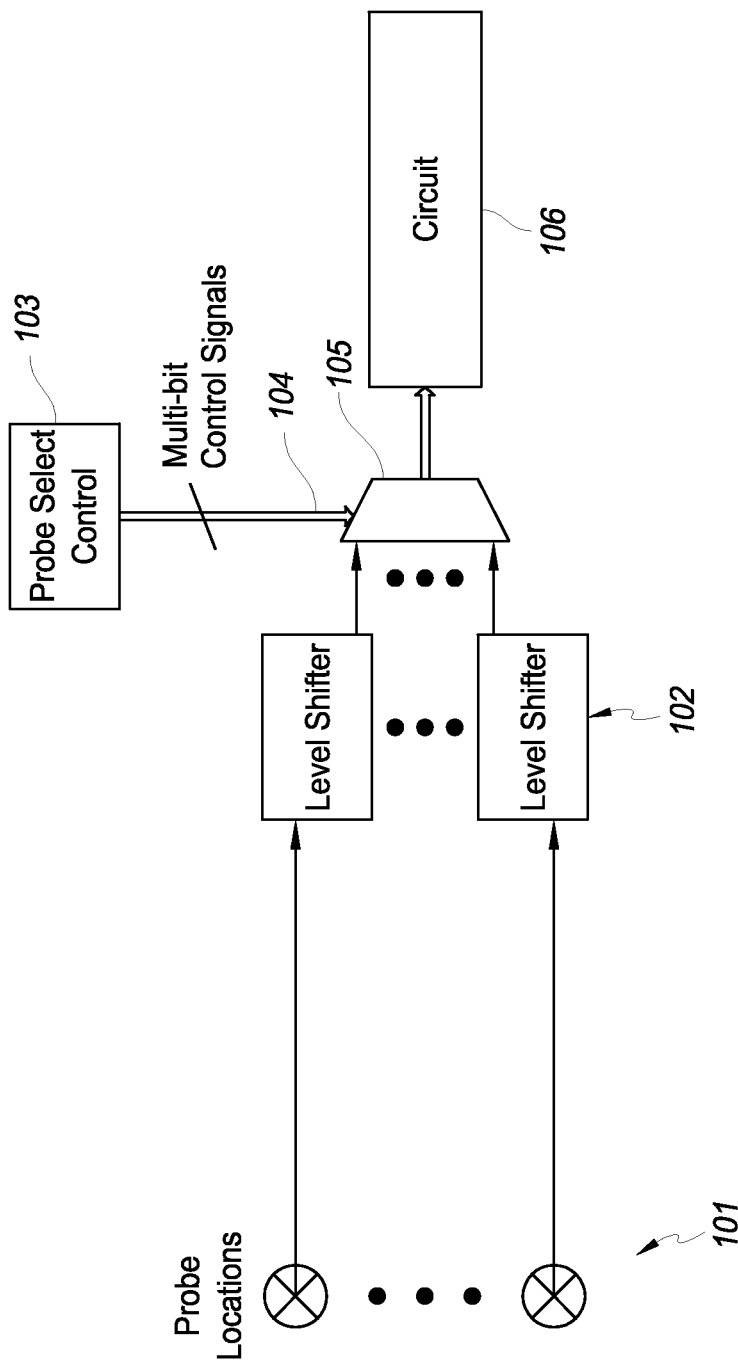
FIG. 1 is a schematic diagram illustrating an embodiment of a voltage rail noise sensing circuit.

Although particular embodiments are described herein, other embodiments of the invention, including embodiments that do not provide all of the benefits and features set forth herein, will be apparent to those of ordinary skill in the art.

In the following, numerous specific details have been set forth to provide a thorough understanding of claimed subject matter. However, it will be understood by those skilled in the art that claimed subject matter may be practiced without these specific details. In other instances, methods and/or circuits that would be known by one of ordinary skill have not been described in detail so as not to obscure claimed subject matter.

Reference throughout this specification to "one embodiment," "an embodiment," or similar expressions mean that a particular feature, structure, and/or characteristic described may be included in one or more embodiments of claimed subject matter. Thus, appearances of phrases such as "in one embodiment," "an embodiment," or similar expressions in various places throughout this specification are not necessarily all referring to the same embodiment. For example, particular features, structures, and/or characteristics may be combined in one or more embodiments.

Embodiments of claimed subject matter may include methods and/or circuits (e.g., an individual circuit or a combination of circuits or components thereof) for performing operations. Likewise, as an example, memory may be employed in a variety of contexts. As one example without limit, memory may be included in a computing system. In this context, the term computing system refers to at least a processor and memory coupled by a bus. Likewise, in this application, the terms memory, memory system, memory module, memory circuit, memory device and/or memory apparatus may be used interchangeably unless the context of usage indicates otherwise. A memory cell, however, refers to a unit of storage within a memory and a memory array refers to an array of memory cells. Typically, the memory cells comprise a memory core. It will be understood, however, that a memory, memory system, memory circuit, memory module, memory device and/or memory apparatus may also include other circuitry or components to enable use of the memory cells. Likewise, a memory subsystem refers to a sub-portion of a memory system.

In an example implementation, a circuit, such as a memory circuit, may be in the form of a memory device, such as a volatile or nonvolatile memory device, for example, which may communicate with one or more processors or other memory access devices via (e.g., through) any of a plurality of associated physical interfaces. As used herein, a "plurality" is two or more. Examples of a nonvolatile memory device include, but are not limited to, for example, phase change memory (PCM), charge storage or floating-gate memory (such as that commonly referred to as flash memory), magnetoresistive random access memory (MRAM) or the like or any combination thereof. Examples of a volatile memory device may include, but are not limited to, for example, dynamic random access memory (DRAM), a static random access memory (SRAM). A memory device, whether volatile or nonvolatile, may, for example, comprise a single channel memory device or a multi-channel memory device. In a multi-channel device, two or more of a plurality of physical interfaces may comprise a substantially similar type or differing types. By way of non-limiting example, in certain implementations, one interface may comprise a parallel interface while another interface may comprise a serial interface.

Although aspects of claimed subject matter will be described below with reference to one or more examples or illustrations, it is to be understood that any examples or illustrations so described are intended to be non-limiting.

FIG. 1 is a schematic diagram illustrating an embodiment of a built-in voltage rail noise sensing circuit. For example, the voltage rail noise sensing circuit can be used to determine an actual noise condition of one or more of locations along a voltage rail and compare the actual noise condition to an expectation for analysis, which can then be used to validate or to refine a simulation model of the IC, to assist in selecting a performance parameter, such as voltage level or clock speed, to improve the performance of future ICs designed with the simulation model. The voltage rail noise sensing circuit can also be used for a built-in self test feature. However, unlike many built-in self test features, the voltage rail noise sensing circuit senses a dynamic condition (noise) and not merely whether a circuit has continuity. In one embodiment, the IC is not a chip for a digital multimeter application or for analog signal processing. In one embodiment, the IC is a digital chip such as, but not limited to, a memory chip, a central processing unit (CPU), a microcontroller, a graphics processing unit (GPU), a northbridge chip, a southbridge chip, a memory controller, a serializer/deserializer (SerDes) or the like, and primarily performs functions unrelated to voltage rail noise sensing.

A voltage supply rail can be implemented by conductive lines or by a plane in one or more metallization layers, by polycrystalline silicon (polysilicon), a combination thereof or the like. While a voltage supply rail can typically be considered to be a single "node" for direct current (DC) purposes, noise can vary considerably for various locations along a voltage supply rail. For example, the operation of digital circuitry can pollute a supply rail with a relatively large amount of switching noise during transitions, which can disturb the operation of other circuits. Various locations can be "probed" to sense the amount of noise at those locations. The sensing circuits described herein and their probes are built into the integrated circuit, and the "probes" do not refer to external probes from test equipment. FIG. 1 illustrates various probe locations 101, voltage level shifters 102, a probe select control circuit 103, a multiplexer 105, and a noise sensing circuit 106.

A variety of circuits can be used for the noise sensing circuit 106 such as, but not limited to, those described in "Circuits and Techniques for High-Resolution Measurement of On-Chip Power Supply Noise," by E. Alon, V. Stojanovic and M. Horowitz, appearing in IEEE Journal of Solid State Circuits, Vol. 40, No. 4, April, 2005, and in "A Built-in Technique for Probing Power Supply and Ground Noise Distribution Within Large-Scale Digital Integrated Circuits," by M. Nagata, T. Okumoto and K. Taki, also appearing in IEEE Journal of Solid State Circuits, Vol. 40, No. 4, April, 2005 The circuits by Alon and Nagata are based on differential circuits and have a limited common mode voltage range, which manifests itself as a limited input voltage operating range, which is typically limited to sensing of noise on a single voltage rail. Thus, while the Alon and Nagata circuits are good at sensing noise on a high voltage supply rail such as VDD, the Alon and Nagata circuits would need to be duplicated and complemented (for example, by swapping PMOS and NMOS and reversing directions of currents) to sense noise outside the common mode voltage range. Also, see U.S. Pat. No. 7,332,916 by Nagata and U.S. Pat. No. 7,667,477 by Nagata, both of which are incorporated by reference herein, for examples of circuits that can be used for the noise sensing circuit 106. In one embodiment, the noise sensing circuit 106 can further generate an output, such as a count, that can be used as a measure of the noise on selected location of the voltage rail. An example of a noise sensing circuit 106 with a ring oscillator and counter configuration will be described later in connection with FIG. 13.

While illustrated in the context of the noise sensing circuit 106 being configured to sense noise at a positive voltage rail such as VDD without the voltage level shifters 102, the principles and advantages disclosed herein are applicable to systems in which the noise sensing circuit 106 is configured to sense noise at a ground voltage rail such as VSS or at a negative voltage rail without the voltage level shifters 102.

For example, when the noise sensing circuit 106 is configured to sense noise on a high voltage supply rail VDD, a low voltage supply rail such as VSS or a negative voltage supply rail would typically be outside the common mode voltage range of the noise sensing circuit 106. Duplication of a circuit can be a waste of chip area and can raise the cost of producing the chip. Further, the use of the same noise sensing circuit 106 for locations from a high voltage supply rail, low or ground voltage supply rail, and/or a negative voltage supply rail reduces possible mismatches between complementary circuits. For example, threshold voltage differences between PMOS and NMOS circuits can complicate control and control timing if complementary circuits were to be used.

To extend the common-mode range of the noise sensing circuit 106, the noise sensing circuit 106 can advantageously be combined with one or more voltage level shifters 102. The voltage level shifters 102 permit the same noise sensing circuit 106 to sense noise on, for example, ground rails and negative voltage rails. If a particular location 101 is for a voltage rail that has a voltage within the common-mode range of the noise sensing circuit 106, the voltage level shifter 102 for that location can be omitted from the signal path. A variety of circuits can be used for the voltage level shifters 102, such as, but not limited to, various topologies that will be described later in connection with FIGS. 4, 5, 7, 9, 11, and 12.

In one embodiment, the locations 101 are distributed throughout the integrated circuit. When validation of the simulation model is a goal, at least some of the locations 101 can correspond to locations that the simulation model indicates are relatively noisy. However, any locations along the voltage rails can be used. An IC chip will typically have two or more voltage supply rails. Out of convenience, for an IC chip having two voltage rails, for example, one may be referred to as the high voltage rail and one may be referred to as the low voltage rail. For an IC chip having more than two rails, the rail having the lowest voltage signal level may be referred to as the low voltage rail or as the lower voltage rail. Likewise, in some situations, some or all of the other voltage rails, if more than one, for example, may be referred to as higher voltage rails. In one example, a low voltage rail may include a voltage rail at a ground potential, referred to here as a ground rail. A rail can also have a negative voltage with reference to ground.

The multiplexer 105 permits two or more locations 101 to be analyzed by the noise sensing circuit 106. The multiplexer 105 can be implemented by an analog multiplexer or by switches. For example, a path to a location 101 under analysis can be switched on by turning on a transistor of the multiplexer 105, and the other paths can be switched off by turning off transistors of the multiplexer 105 to implement the multiplexer 105. The probe select control circuit 103 can provide control signals 104 to the multiplexer 105 to control which input of the multiplexer 105 is provided as an output of the multiplexer 105.

In the embodiment illustrated in FIG. 1, the voltage level shifters 102 are in the signal path between the locations 101 and the multiplexer 105. One advantage of the configuration of FIG. 1 is that individual level shifters of the voltage level shifters 102 can vary in circuit topology as desired for coupling to locations 101 of varying voltage levels. However, other configurations are possible.

Figure 2:
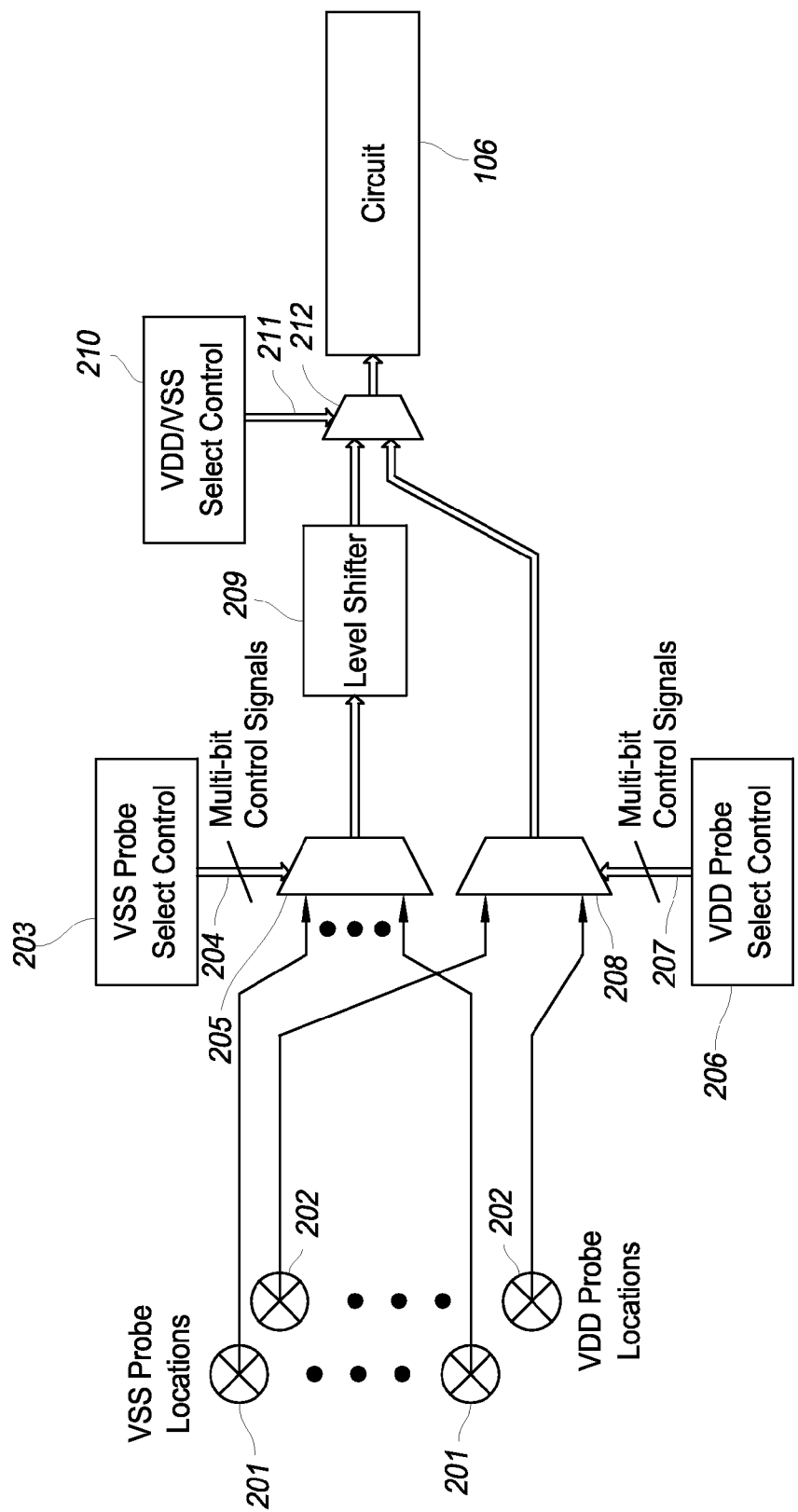
FIG. 2 is a schematic diagram illustrating another embodiment of a voltage rail noise sensing circuit.

FIG. 2 illustrates an alternative embodiment of a voltage rail noise sensing circuit. The voltage rail noise sensing circuit includes VSS probe locations 201, VDD probe locations 202, a VSS probe select control circuit 203, control signals 204, a VSS multiplexer 205, a VDD probe select control circuit 206, control signals 207, a VDD multiplexer 208, a level shifter 209, a VDD/VSS select control circuit 210, control signals 211, a VDD/VSS multiplexer 212, and the noise sensing circuit 106.

In FIG. 2, the level shifter 209 is in a signal path after the VSS multiplexer 205, thereby permitting the level shifter 209 to be shared among two or more VSS probe locations 201. The VSS probe locations 201 are provided as inputs to the VSS multiplexer 205. A particular input is selected as an output of the VSS multiplexer 205 under the control of the VSS probe select control circuit 203. The output of the VSS multiplexer 205 is provided as an input to the level shifter 209. The level shifter 209 shifts the level of the signal at its input to generate an output having a level that is appropriate for the noise sensing circuit 106. The output of the VSS multiplexer 205 is provided as an input to the VDD/VSS multiplexer 212 through the level shifter 209. In one embodiment, the control circuits 203, 206, 210 are combined into the same circuit. For example, the control signals 204, 207, 211 can correspond to address lines for selection of the probe locations. In one embodiment, the control signals 204, 207 can be the same signals or complements of each other.

The VDD probe locations 202 are provided as inputs to the VDD multiplexer 208. A particular input is selected as an output of the VDD multiplexer 208 under the control of the VDD probe select control circuit 206. The output of the VDD multiplexer 208 is provided as an input to the VDD/VSS multiplexer 212. In the illustrated embodiment, the noise sensing circuit 106 is configured to sense noise on the VDD rail so that the signal path from the VDD probe locations 202 to the noise sensing circuit 106 does not use a level shifter.

Under the control of the VDD/VSS select control circuit 210, the VDD/VSS multiplexer 212 selects either the level-shifted output of the level shifter 209 or the output of the VDD multiplexer 208 as an output, which is provided as an input to the noise sensing circuit 106. The embodiment illustrated in FIG. 2 efficiently provides a way to sense noise on both the VDD and VSS rails even when the noise sensing circuit 106 by itself is not well adapted to sensing noise on at least one of the VDD or VSS rails. In addition, the noise sensing circuit 106 can be used to sense noise on other voltage rails if present on the integrated circuit.

In another embodiment, another voltage rail, such as a negative voltage rail, can have probe locations which are coupled to inputs of another multiplexer, which in turn has an output that is provided as an input to a level shifter, which in turn has an output that is provided as an input to another input of the VDD/VSS multiplexer 212.

Figure 3:
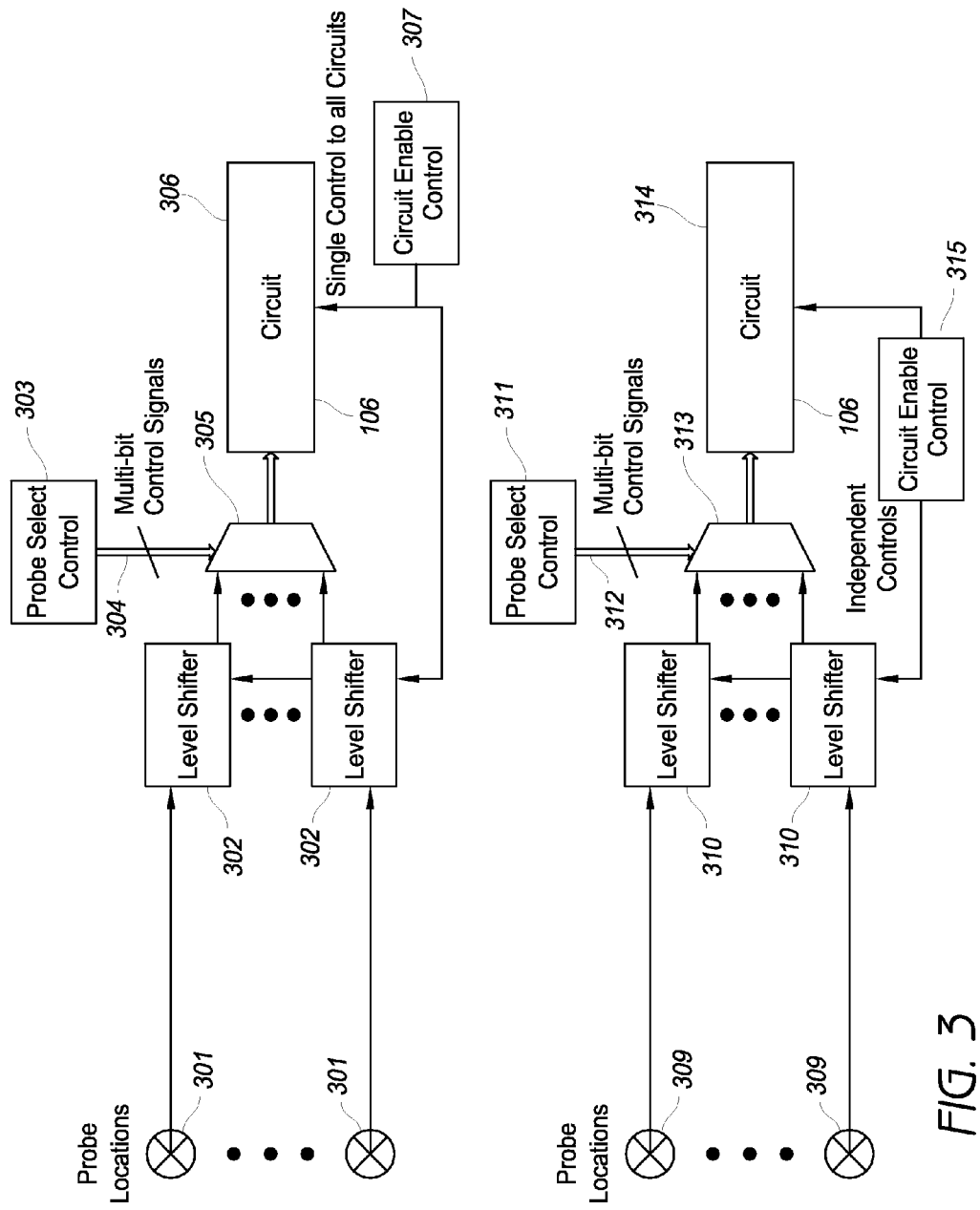
FIG. 3 is a schematic diagram illustrating yet another embodiment of a voltage rail noise sensing circuit.

FIG. 3 is a schematic of yet another embodiment configured to save power. In this embodiment there are one or more sets of probing circuitry. In a first set, signals associated with the locations 301 can be level shifted via the voltage level shifters 302. A probe select control circuit 303 can provide multi-bit control signals 304 to control a multiplexer 305 to select from among the locations 301. A noise sensing circuit 306 can sense noise as described earlier for the noise sensing circuit 106 (FIGS. 1 and 2). In this embodiment, a circuit enable control circuit 307 can turn on/off the level shifters 302 and the noise sensing circuit 306 to conserve power when not in use. In a second set, signals associated with the locations 309 can be level shifted via the voltage level shifters 310. A probe select control circuit 311 can provide multi-bit control signals 312 to control a multiplexer 313 to select from the locations 309. A noise sensing circuit 314 is configured to sense noise as described earlier in connection with the noise sensing circuit 106. A circuit enable control circuit 315 can turn on/off the level shifters 310 and/or the noise sensing circuit 314 to conserve power when not in use.

In some situations in which the noise sensing is performed only for development or for manufacturing test, it can be desirable to disable the noise sensing circuitry for the end-user to save power. In other cases, it may be desirable to provide a capability to sense (for example, detect) voltage noise for a chip purchaser. Circuit enable control circuits 307, 315 may be useful depending upon a particular desire.

Various embodiments of voltage level shifters will now be described. Many of the following embodiments feature a DC blocking portion and a level-setting device. The level-setting device can be a resistor, a transistor, a diode, or some combination of the same. In the illustrated embodiment, the level-setting device corresponds to a pull-up resistor, but in a complementary embodiment, a pull-down resistor can be used. In addition, the various embodiments are described in the context of the noise sensing circuits 106, 306, 314 being configured to sense noise at a positive voltage rail such as VDD without the use of voltage level shifters and thus level-setting devices are used for providing a DC bias for sensing noise at other voltage rails. It will be understood that the principles and advantages disclosed herein are also applicable to systems in which the noise sensing circuits 106, 306, 314 are configured to sense noise at a ground voltage rail such as VSS or at a negative voltage rail without the use voltage level shifters, and pull-down devices can be used instead for providing a DC bias for sensing noise at other voltage rails.

Figure 4:
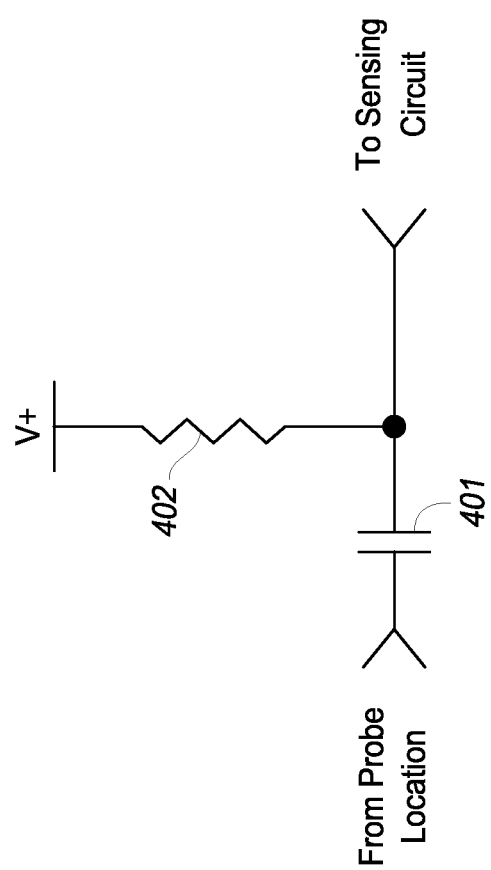
FIG. 4 is a schematic diagram illustrating an embodiment of a voltage level shifter.

FIG. 4 is a schematic diagram of an embodiment of a voltage level shifter, which uses capacitive coupling or AC coupling. The voltage level shifter of FIG. 4 includes a capacitor 401 and a pull-up resistor 402 for the level-setting device. A first end of the capacitor 401 is coupled, directly or indirectly, to a probed location 101. A second end of the capacitor 401 is coupled, directly or indirectly, to the noise sensing circuit 106, 306, 314. It will be understood that other components, such as multiplexers, can also be present in a signal path that includes the capacitor 401.

The capacitor 401 blocks a direct current (DC) component of a voltage rail signal of a probed location 101. One end of the pull-up resistor 402 is tied to a V+ reference voltage and the other end is tied to a node including the second end of the capacitor 401. The pull-up resistor sets the DC component of the level-shifted voltage rail signal.

In one embodiment, the pull-up resistor 402 is tied to a reference voltage or to a voltage source (for example, a power supply) that is relatively "quiet" (for example, has sufficiently little noise associated with it so as not to interfere with noise sensing of a voltage rail). Examples of a relatively quiet voltage source may include, for example, a band gap circuit, a filtered version of a VDD voltage rail, an external quiet power source, or other power source that is not necessarily coupled to a variety of other circuits. A relatively quiet voltage source may be present on-chip for clock distribution, for phase locked loop circuitry, for delay locked loop circuitry, etc. Typically, however, more circuits coupled to a power source may result in more noise on a rail, such as due to stray circuit capacitance(s), stray circuit inductance(s), etc. Therefore, alternatively, a separate power source can be provided as a quiet voltage source, if desired.

Figure 5:
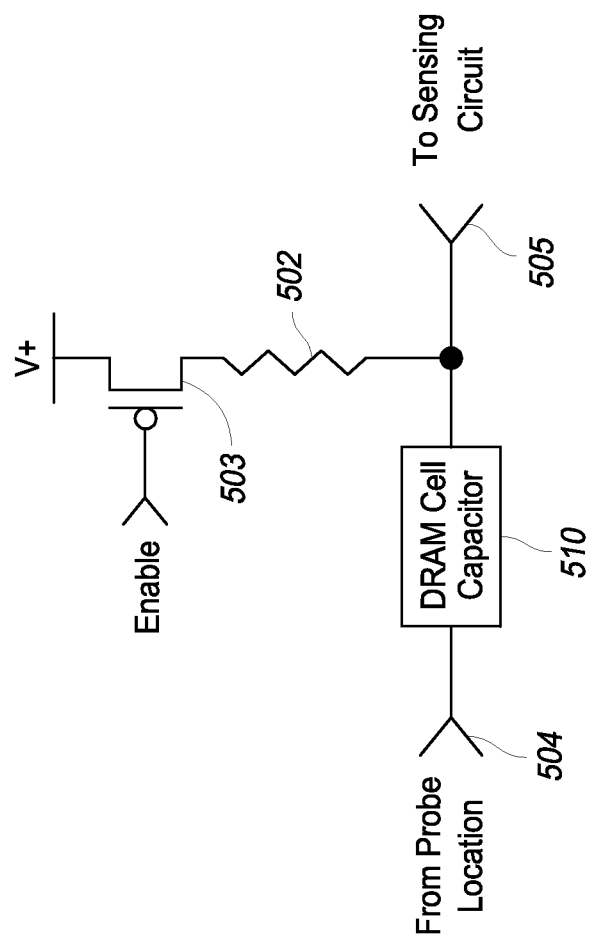
FIG. 5 is a schematic diagram illustrating another embodiment of a voltage level shifter.

FIG. 5 is a schematic diagram illustrating another embodiment of a voltage level shifter. Some ICs can correspond to dynamic random access memory (DRAM) chips or to chips that incorporate DRAM technology. In the illustrated embodiment, the coupling capacitor is implemented using a DRAM cell capacitor 510. An entire memory cell is not needed; only the capacitor portion. When the IC is a DRAM chip, one advantage is that the manufacturing process can be optimized for producing the capacitors of DRAM cells of a DRAM array with a relatively high yield so that the use of the same capacitor for the coupling capacitor that is made for a DRAM cell takes advantage of the optimized process having an efficiently high amount of capacitance per unit area for a favorable layout. Capacitors can be embodied in other forms. In an alternate embodiment, a metal-oxide-semiconductor field-effect transistor (MOSFET) can operate as a capacitor by connecting its source and its drain together, and using the gate as one end of the capacitor, and a combined source, drain, and body as the other end of the capacitor, which can be referred to herein as a MOS capacitor. A MOS capacitor can also be made without forming the source and drain regions, and using the gate as one end of the capacitor and the body as the other end of the capacitor. Isolation techniques can be used to isolate the bulk from ground. It will be understood that while the terms "metal" and "oxide" are present in the name of the device, these transistors can have gates made out of materials other than metals, such as polycrystalline silicon, and can have dielectric oxide regions made from dielectrics other than silicon oxide, such as from silicon nitride or high-k dielectrics. A capacitor can be embodied in other alternative ways including, but not limited to, reverse-biased diodes, metal-insulator-metal (MIM) capacitor or the like. Other types of capacitors will be applicable and readily determined by one of ordinary skill in the art.

The amount of capacitance to use for capacitive coupling can be subject to a tradeoff. The higher the amount of capacitance is, the lower the cutoff frequency of the high-pass characteristics of the coupling capacitor. However, the higher the amount of capacitance is, the more the on-chip space that will be used by the capacitor, which can increase production costs. An example value of capacitance can be, but is not limited to 30 picofarads (pF).

Figure 7:
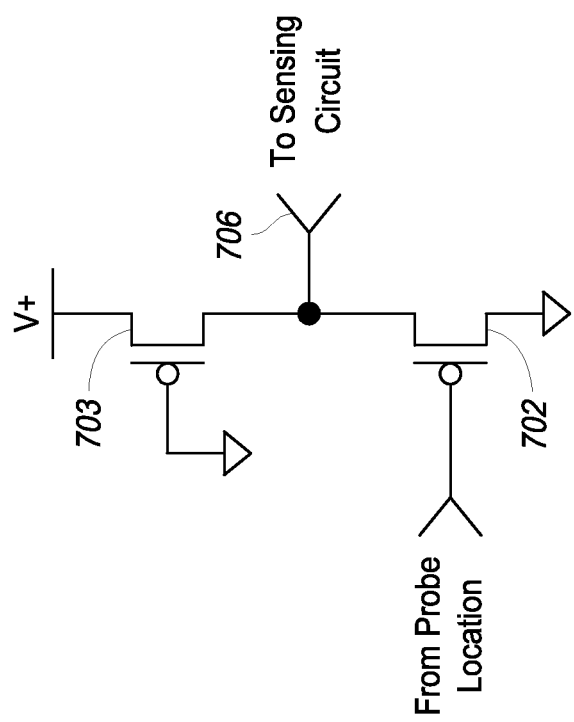
FIG. 7 is a schematic diagram illustrating a DC-coupled embodiment of a voltage level shifter.

The illustrated embodiment uses a pull-up resistor 502 as the level-setting device. In addition to the pull-up resistor 502, the level shifter of FIG. 5 includes an optional PMOS transistor 503. The optional PMOS transistor 503 can be switched on/off via a low/high input at the gate to enable/disable the voltage level shifter, which can be used to save power. The PMOS transistor 503 can also be left on by tying the gate low, such as at ground potential. However, the on resistance of the PMOS transistor 503 may also contribute resistance to the total pull-up resistance. FIG. 7 illustrates an alternative embodiment in which the full pull-up resistance is provided by a transistor, without an explicit resistor. In an alternative embodiment, the capacitance of the DRAM cell 510 is combined with only one of the pull-up resistor 502 or the PMOS transistor 503. When the PMOS transistor 503 is switched off, some noise may still be observable at an output port 505, but at a lower DC voltage signal level which would affect the sensitivity of the noise sensing circuit 106, 306, 314. In alternate embodiments, the PMOS transistor 503 may additionally or alternately perform other functions, such as, for example, to turn off noise sensing circuitry or to enable/disable an embodiment including multiple probe locations, such as described in more detail later in connection with FIGS. 1-3 and 13.

Figure 6:
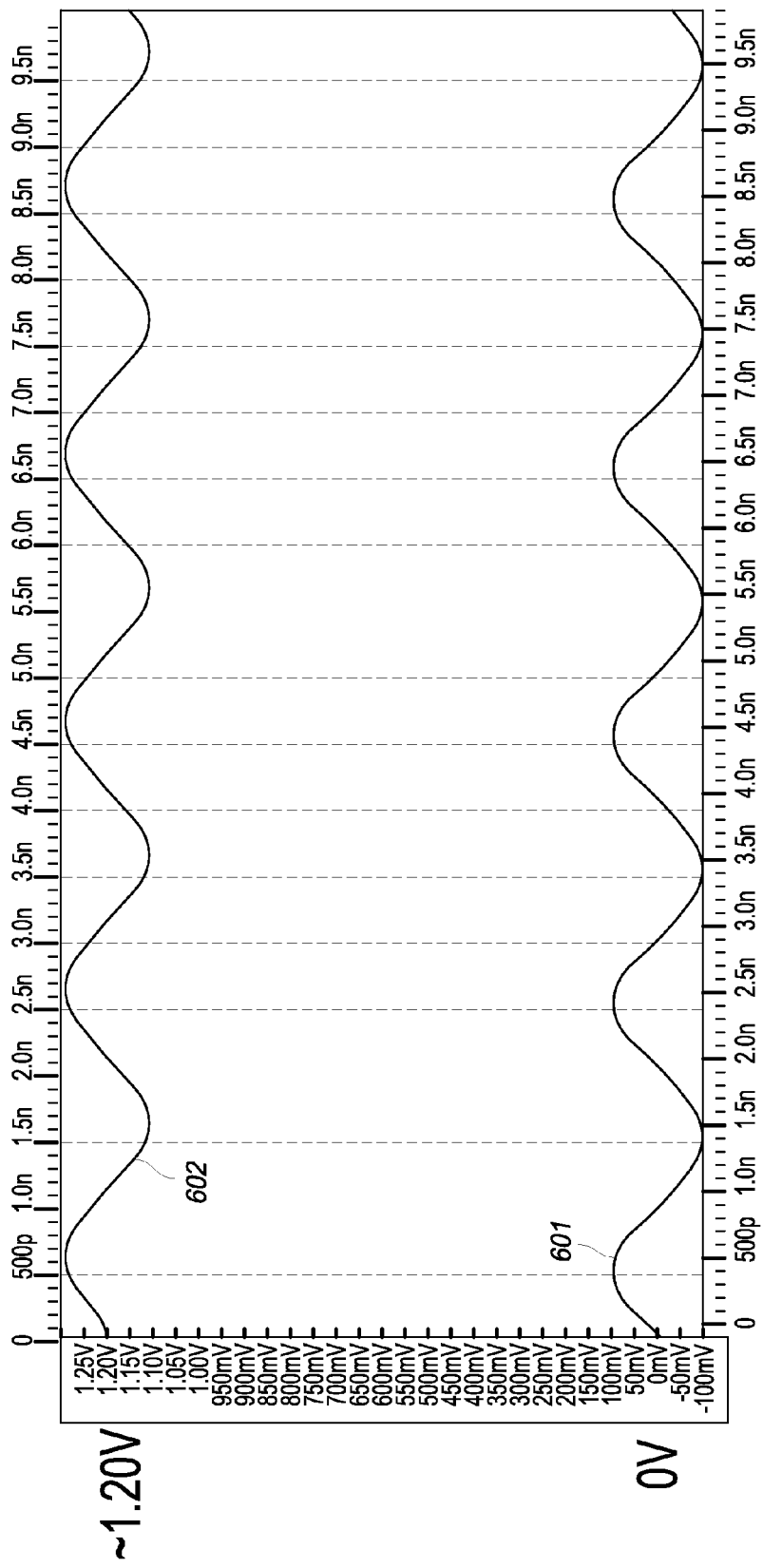
FIG. 6 is a graph illustrating simulation results of the voltage level shifter of FIG. 4 or FIG. 5.

FIG. 6 is a graph illustrating simulation results of the voltage level shifter according to FIG. 4 or 5. This graph shows a first curve 601, representing a voltage rail signal oscillating at 500 MHz with a voltage swing of 100 mV above and below a DC component of about 0V. The graph also shows a second curve 602, representing a level-shifted voltage rail signal 602, oscillating at 500 MHz and having a DC component of about 1.2 V rather than 0 V. Of course, an appropriate voltage level shift will vary with circuitry and other embodiment particulars. Here, with a voltage level shift of 1.2 V, noise oscillation on the relatively lower voltage rail is $\frac{1}{12}^{th}$ or 8.3% of the DC component of the voltage rail signal. In at least some circumstances, this might be sufficient to at least potentially adversely affect circuit operation.

In one embodiment, a method of sensing voltage rail noise of a lower voltage rail from a power supply may comprise the following. For example, an embodiment may include AC coupling a lower voltage rail signal and voltage level shifting the lower voltage rail signal to a voltage signal level sufficient to enable operation of an on chip voltage signal sensing circuit. The voltage signal sensing circuit may comprise an MOS or bipolar transistor in an embodiment. As mentioned previously, AC coupling and voltage level shifting may be performed on chip. Likewise, voltage level shifting on chip may include using a pull up resistor and AC coupling may include signal transfer via a capacitor, which may be implemented using a capacitor ordinarily used for a DRAM cell or an MOS capacitor, as mentioned above.

The AC-coupled voltage level-shifting embodiments described earlier in connection with FIGS. 4 and 5 can provide a reasonable amount of bandwidth, but AC coupling inherently has a low-frequency cutoff. To decrease the cutoff frequency, a larger amount of capacitance can be used for the coupling capacitance. For better low-frequency performance without incurring a possible cost penalty of a relatively large amount of capacitance, a DC-coupled level shifter can be used.

FIG. 7 is a schematic diagram of a DC-coupled embodiment of a voltage level shifter. FIG. 7 illustrates a source follower topology. The illustrated embodiment of a source-follower voltage rail signal level shifter circuit can include two PMOS transistors 702, 703. The PMOS transistor 702 is in a source follower configuration, and the PMOS transistor 703 is configured as a level-setting device. While illustrated with the gate pulled low, in an alternative embodiment, the PMOS transistor 703 can be switched on/off as described earlier in connection with FIG. 5. The voltage "drop" from gate to source of the PMOS transistor 702 provides the level shift, and the on resistance of the PMOS transistor 703 provides biasing. Of course, it will be understood that the DC level at the source of the PMOS transistor 702 is higher than the DC level of the gate of the PMOS transistor 702.

In the level shifter illustrated in FIG. 7, a drain of the PMOS transistor 702 may be coupled to ground, while a source of the PMOS transistor 702 may be coupled to a drain of the PMOS transistor 703. A source of the PMOS transistor 703 is coupled to a voltage source V+. A gate of the transistor 703 can be coupled to ground potential or to a suitable reference voltage source (e.g., a bandgap reference, a resistor-divider circuit, a voltage regulator, etc.). It may be desirable for the ground potentials and the voltage source to be quiet and to be electrically independent of one another to reduce potential superposition or undesirable signal cancellation or noise.

To yield a desired output voltage level at an output node 706 corresponding to the source of the PMOS transistor 702 and the drain of the PMOS transistor 703, of course, the voltage source V+ should have a voltage level higher than a desired output level-shifted voltage rail signal level. For instance, if a desired output level-shifted voltage rail signal level comprises 1.2V, a voltage source V+ of 2.5V may be used. Typically, for an IC chip, such as for a DRAM circuit, for example, a variety of different level voltage sources may be available on-chip. For instance, in a DRAM employing double data rate type three synchronous DRAM (DDR3), a voltage level of 1.5V is commonly available and may be raised slightly, such as via a charge pump, for example to provide a voltage source V+. In an alternative embodiment, a resistor is used as a level-setting device instead of the PMOS transistor 703.

FIGS. 8A and 8B are graphs illustrating operation of the voltage level shifter of FIG. 7. FIG. 8A is a graph of a simulation of a voltage rail signal at 500 MHz with a 100 mV swing around 0V. FIG. 8B is a graph of a level-shifted voltage rail signal, also at 500 MHz with a 65 mV swing around 1.24 V. From FIGS. 8A and 8B, it can be seen that the noise portion of the level-shifted voltage rail signal is attenuated via a source follower configuration, in addition to the level-shifted voltage rail signal being voltage level shifted.

Figure 9:
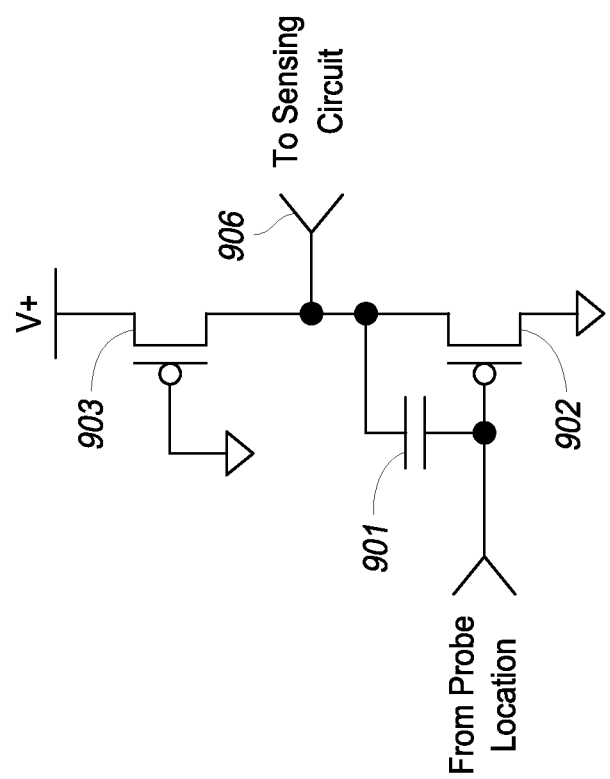
FIG. 9 is a schematic diagram illustrating still another embodiment of a voltage level shifter.

FIG. 9 is a schematic diagram of an alternate embodiment of a voltage level shifter. This embodiment also includes a PMOS transistor 902 in a source follower circuit configuration and a PMOS transistor 903 as a level-setting device, which operate as described for the PMOS transistor 702 and the PMOS transistor 703, respectively, of FIG. 7. While illustrated with the gate pulled low, in an alternative embodiment, the PMOS transistor 703 can be switched on/off as described earlier in connection with FIG. 5. However, in addition, in this embodiment, a bypass capacitor 901 may be coupled across the source and the gate of the PMOS transistor 902. An output node 906 is at a source of the PMOS transistor 902, drain of the PMOS transistor 903, and an end of the capacitor 901. The bypass capacitor 901 represents deliberately added capacitance and not merely parasitic capacitance. The illustrated configuration thus has the relatively good low frequency performance of a DC-coupled level shifter and the relatively good high frequency performance of an AC-coupled level shifter. Additionally, the capacitance of the capacitor 901 can be smaller than the capacitance used with the embodiments previously discussed with respect to FIGS. 4 and 5.

Figure 10:
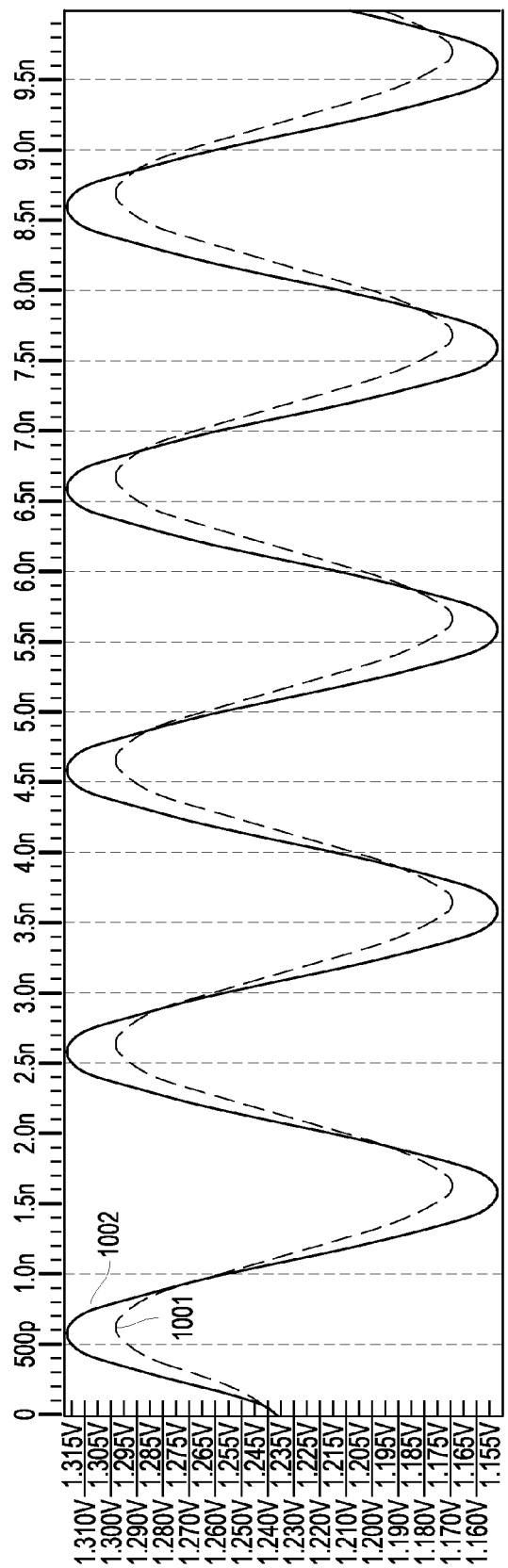
FIG. 10 is a graph illustrating operation the voltage level shifter of FIG. 9 compared with the voltage level shifter of FIG. 7.

FIG. 10 is a graph illustrating operation the voltage level shifter of FIG. 9 compared with the voltage level shifter of FIG. 7. FIG. 10 is a graph illustrating two waveforms juxtaposed with the waveform 1001 representing voltage at the output node 706 of FIG. 7 (without a capacitor), and the waveform 1001 representing voltage at the output node 906 with the capacitor 901. While the waveform 1001 is similar to that shown in FIG. 8B, the waveform 1002 illustrates the effect of including the bypass capacitor 901. As illustrated, a greater amount of the voltage rail signal is observed as having been transferred.

Figure 11:
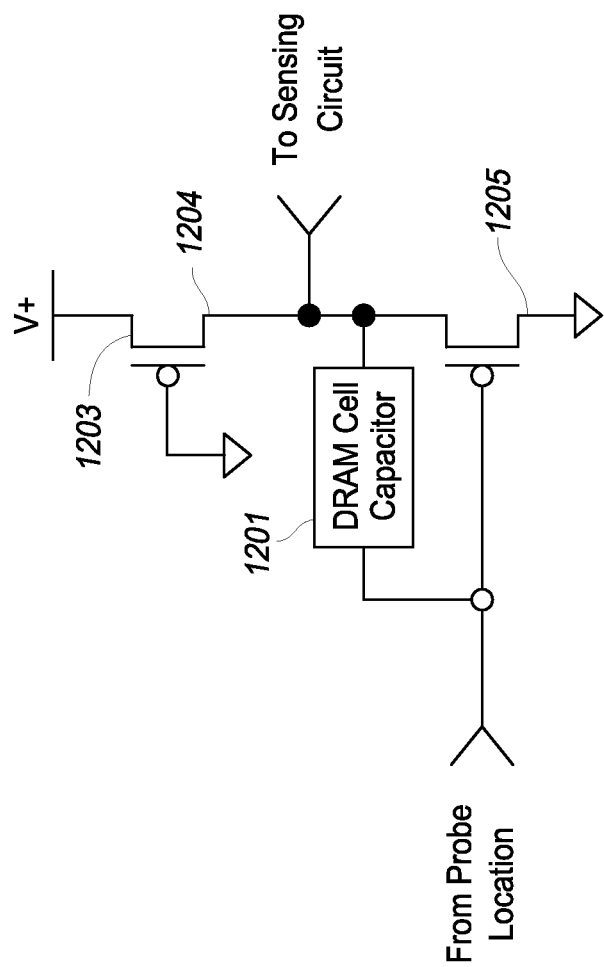
FIGS. 11 and 12 are schematic diagrams illustrating additional embodiments of a voltage level shifter.

FIG. 11 is a diagram illustrating an embodiment similar to that shown in FIG. 9; however, a capacitor is embodied as a memory cell capacitor 1201, similar to the approach discussed earlier in connection with FIG. 5. In this example embodiment, a capacitance exceeding about 4 pF is employed; however, other applicable values will be readily determined by one of ordinary skill in the art. Also a PMOS transistor 1203 is used as a level-setting device. While illustrated with the gate pulled low, in an alternative embodiment, the PMOS transistor 1203 can be switched on/off as described earlier in connection with FIG. 5. In one embodiment, a source of the PMOS transistor 1203 may be at 2.5V while a drain 1204 of the PMOS transistor 1203 may have a DC level of 1.2V.

Figure 12:
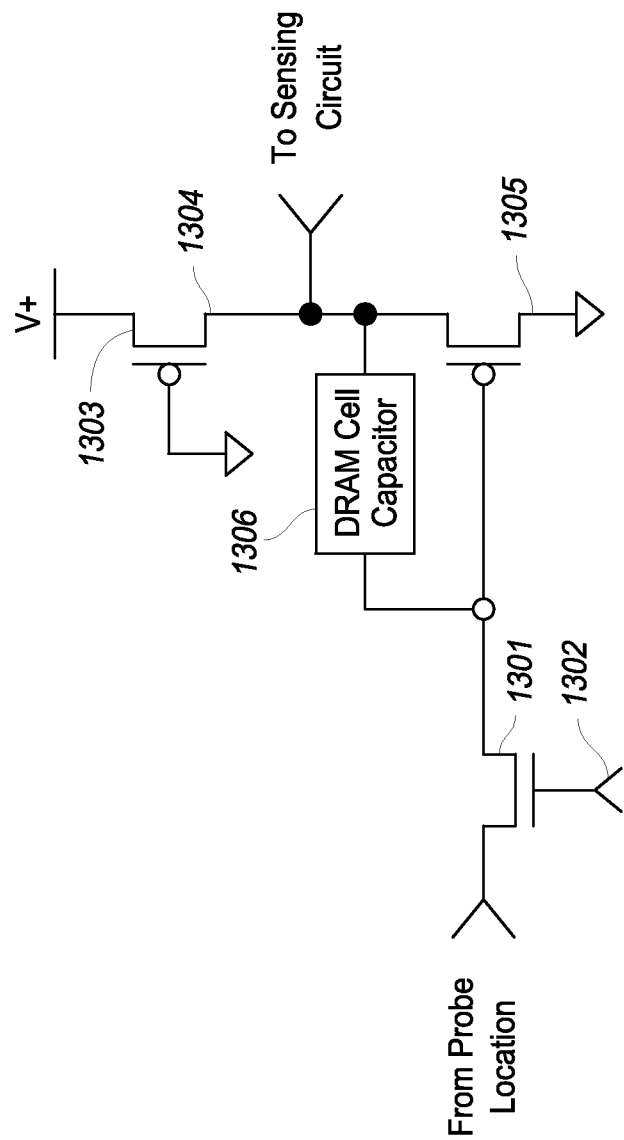

FIG. 12 is a diagram illustrating an embodiment of a voltage level shifter similar to that described earlier in connection with FIG. 11. The illustrated voltage level shifter includes a PMOS transistor 1305 in a source-follower configuration, a PMOS transistor 1303 configured as a level-setting device, and an optional DRAM cell 1306 for high-frequency bypass. While illustrated with the gate pulled low, in an alternative embodiment, the PMOS transistor 1303 can be optionally switched on/off as described earlier in connection with FIG. 5. The voltage level shifter of FIG. 12 further includes a MOS transistor 1301 to switch a noise voltage signal from a probe location. In one embodiment, the transistor 1301 may comprise an N-type MOS (NMOS) transistor. In an alternative embodiment, the transistor 1301 can be implemented by an NMOS transistor and a PMOS transistor in a CMOS configuration. The transistor 1301 can function as a passgate transistor. An enable signal 1302 may be driven high, for instance 1.2V, to turn the NMOS transistor 1301 on, and driven low, such as to 0V, to turn the NMOS transistor 1301 off. Alternatively, for an embodiment in which the voltage rail noise sensing circuit is implemented in a complementary manner such that the voltage rail noise sensing circuit senses near VDD, a PMOS transistor can be used instead of the NMOS transistor for the transistor 1301. When turned off, the NMOS transistor 1301 can help to isolate VPP noise from probed locations. The NMOS transistor 1301 can also be used to implement multiplexing and/or as a sampling switch.

Figure 13:
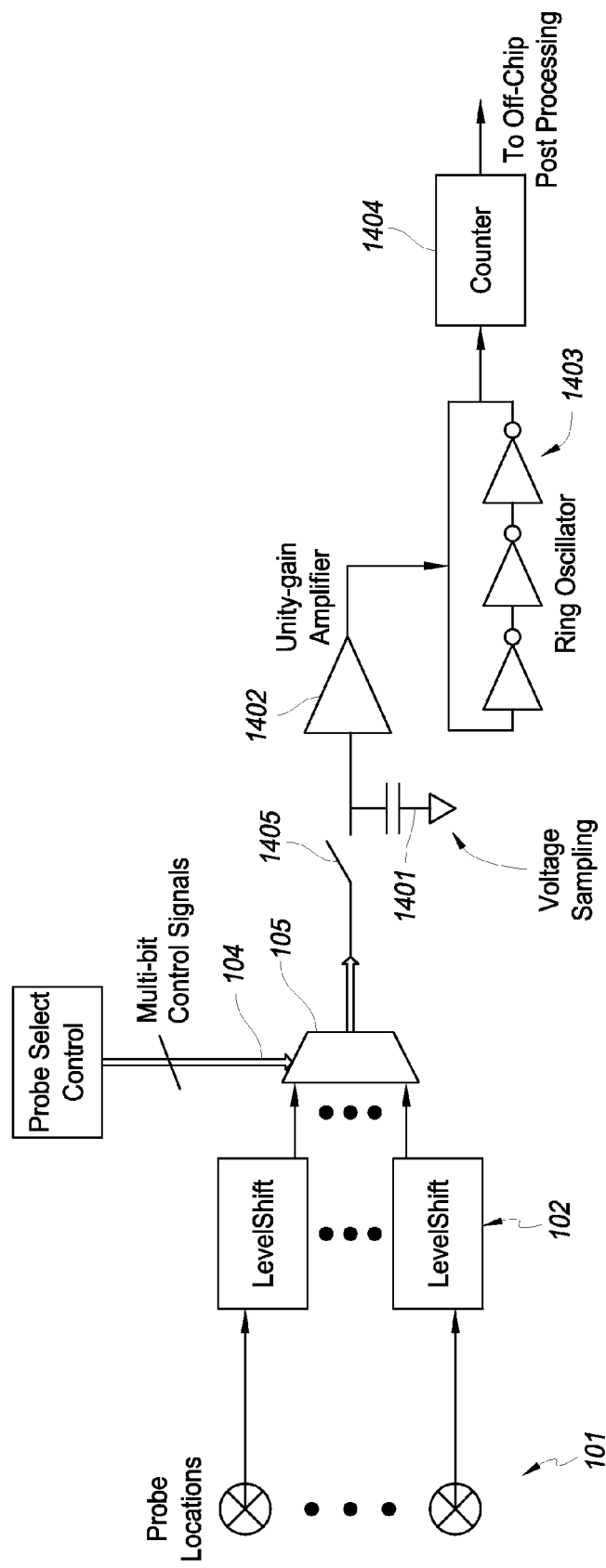
FIG. 13 is a schematic diagram illustrating still another embodiment that may employ multiplexing and illustrating an embodiment of a voltage rail signal sensing circuit.

FIG. 13 shows an embodiment sharing some features with the circuit of FIG. 1 with circuitry 101, 102, 105 illustrated to facilitate voltage rail noise sensing. The configurations described earlier in connection with FIGS. 2 and 3 can alternatively be used. An output of the multiplexer 105 (FIG. 1), the VDD/VSS multiplexer 212 (FIG. 2), the multiplexer 305 (FIG. 3), or the multiplexer 313 (FIG. 3) is provided as an input to a sampling circuit 1405, 1401.

The sampling circuit can include a sampling switch 1405 and a sampling capacitor 1401. The sampling switch 1405 is closed to sample the noise signal to the sampling capacitor 1401, and is opened to hold the sample on the sampling capacitor 1401. The sampling switch 1405 can be implemented with a MOS transistor. In addition, when capacitive coupling is used in a level shifter 102, the capacitance of the sampling capacitor 1401 can form a capacitive voltage divider with the coupling capacitance.

The sampling capacitor 1401 of the sampling circuit stores charge to store the sample, and thus provides a voltage as an output. In the illustrated embodiment, the output of the sampling circuit is provided as an input to a unity gain amplifier 1402, which buffers the stored sample. In alternative embodiments, the unity gain amplifier 1402 can be replaced with another buffer circuit that has gain or loss. A level-setting circuit can optionally be used. An output of the unity gain amplifier 1402 is provided as an input to a ring oscillator 1403 and to a counter 1404. In one embodiment, a frequency of oscillation of the ring oscillator 1403 is proportional to the level of the sampled voltage. A count by the counter 1404 of the frequency of oscillation taken over a period of time can then indicate the level of the sampled voltage. The counts of multiple samples can then provide a measure of the noise present on the voltage rail signal. The counts can be provided for post-processing, such as off chip. In one embodiment, the count technique can be used for or as an alternative to the noise sensing circuits 106, 306, 314 described earlier in connection with FIGS. 1 and 3. The voltage sampling circuit 1405, 1401, and the counter circuitry 1402, 1403, 1404 can be combined with any of multiplexing and/or level-shifting techniques described earlier in connection with FIGS. 1-5, 7, 9, and 11-12.

In one or more embodiments, a circuit may be specially constructed for desired purposes and/or an apparatus may comprise a general-purpose computing device capable of operating in accordance with a computer program stored in memory. A program may be stored in memory, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs) and/or FLASH memories, phase change memories (PCM) and/or any other type of media, such as a computer readable medium, suitable for storing instructions, such as software instructions.

A memory typically may comprise a non-transitory component. In this context, a non-transitory memory may include a component that is tangible, meaning that the component has a concrete physical form, although the component may change its physical state. Thus, for example, non-transitory refers to a component capable of remaining tangible despite a change in physical state.

In describing embodiments of claimed subject matter, the term "bit" corresponds to a binary digit of data, such as represented by a state of a binary digital signal, which is sometimes also referred to as a logic signal, a binary signal, a logic state, or a binary state. The value of a bit, a fraction of a bit, or multiple bits may be stored by programming (e.g., writing to) a memory cell, such as a single transistor, for example, to one of a plurality of physical states, referred to here as a data state for convenience. For example, in a single level memory cell, the cell might be programmed to a first (e.g., logic 1) data state or a second (e.g., logic 0) data state. Additionally, multiple binary digital signals and/or multiple data states comprising individual binary digital signals and/or data states may be organized and/or aggregated to construct (e.g., assemble) a "symbol," which may collectively represent, for example, two bits, four bits, eight bits, 10 bits, and so forth. In one example, a 2-bit symbol may comprise a binary value of 00, 01, 10, or 11. In some cases, a single memory cell may be selectively programmed to a respective data state representing any one of those values. For example, a binary 00 value for a 2-bit symbol may be stored by programming a memory cell to a respective one of four possible data states (e.g., corresponding to a respective range of threshold voltage levels in an embodiment). In a similar manner, a particular value of a 4-bit symbol (e.g., 0101) may be stored by programming one or more memory cells to a respective one of 16 possible data states, and a particular value of an 8-bit symbol (e.g., 0000 0110) may be stored by programming one or more memory cells to a respective one of 256 different data states, and so forth. Any of the foregoing symbols may be communicated as representing one or more measurable physical properties (e.g., an acoustic, current, radiation, and/or voltage level) of, for example, one or more signals or states. For example, without limitation, a binary digital signal, such as a "1" or "0," in an embodiment may be reflected as a voltage signal level within respective sets of voltage signal level ranges.

The foregoing description and following claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

While there has been illustrated and/or described what are presently considered to be example features, it will be understood by those skilled in the relevant art that various other modifications may be made and/or equivalents may be substituted, without departing from claimed subject matter. Additionally, many modifications may be made to adapt a particular situation to the teachings of claimed subject matter without departing from the central concept(s) described herein. Therefore, it is intended that claimed subject matter not be limited to the particular examples disclosed, but that such claimed subject matter may also include all aspects falling within appended claims and/or equivalents thereof.

One embodiment includes an integrated circuit, wherein the integrated circuit includes: a noise sensing circuit having an input voltage operating range; and a voltage level shifter coupled to the voltage signal measurement circuit to level shift a DC component of a voltage rail signal from a first voltage level to a second voltage level, wherein the first voltage level is outside the input voltage operating range of the noise sensing circuit, and wherein the second voltage level is within the input voltage operating range, wherein the voltage rail signal is sourced from a voltage rail within the integrated circuit.

One embodiment includes a method of sensing noise on a voltage rail of an integrated circuit (IC), wherein the method includes: voltage level shifting a DC component of a voltage rail signal from a first voltage level to a second voltage level to generate a level shifted voltage rail signal, wherein a probe location along the voltage rail comprises a source for the voltage rail signal; and sensing noise present on the level shifted voltage rail signal using a noise sensing circuit, wherein the first voltage level is outside an input voltage operating range of the noise sensing circuit, and wherein the second voltage level is within the input voltage operating range.

Various embodiments have been described above. Although described with reference to these specific embodiments, the descriptions are intended to be illustrative and are not intended to be limiting. Various modifications and applications may occur to those skilled in the art.

I claim:

1. An integrated circuit comprising:
   a noise sensing circuit having an input voltage operating range; and
   a voltage level shifter coupled to the voltage signal measurement circuit to level shift a DC component of a voltage rail signal from a first voltage level to a second voltage level, wherein the first voltage level is outside the input voltage operating range of the noise sensing circuit, and wherein the second voltage level is within the input voltage operating range, wherein the voltage rail signal is sourced from a voltage rail within the integrated circuit.

2. The integrated circuit of claim 1, wherein the voltage rail comprises a ground rail.

3. The integrated circuit of claim 1, wherein the level shifter is configured to provide AC coupling.

4. The integrated circuit of claim 1, wherein the voltage level shifter comprises:
   a capacitance; and
   a level-setting device coupled to the capacitance and the voltage sensing circuit.

5. The integrated circuit of claim 4, wherein the integrated circuit comprises a DRAM memory device, and wherein the capacitance comprises a capacitor formed at the same time as capacitors for a DRAM memory array of the DRAM memory device.

6. The integrated circuit of claim 4, wherein the capacitance comprises a MOS capacitor.

7. The integrated circuit of claim 1, wherein the voltage level shifter comprises a DC-coupled level shifter circuit.

8. The integrated circuit of claim 7, wherein the source-follower voltage level shifter circuit comprises a transistor configured in a source follower circuit configuration and a level-setting device.

9. The integrated circuit of claim 8, wherein the voltage level shifter further comprises a bypass capacitance coupled between an input and an output of the level shifter circuit.

10. The integrated circuit of claim 9, wherein the integrated circuit comprises a DRAM memory device, and wherein the bypass capacitance comprises a capacitor formed at the same time as capacitors for a DRAM array of the DRAM memory device.

11. The integrated circuit of claim 9, wherein the bypass capacitance comprises a MOS capacitor.

12. The integrated circuit of claim 1, wherein the noise sensing circuit comprises at least one of an MOS transistor or bipolar transistor.

13. The integrated circuit of claim 1, further comprising:
a plurality of voltage level shifter circuits coupled to different points of the voltage rail, the plurality of voltage level shifter circuits configured to generate a plurality of level-shifted voltage rail signals; and
a multiplexer in a signal path between the voltage level shifters and the noise sensing circuit, wherein the multiplexer is configured to select a particular level-shifted voltage rail signal from the plurality of level-shifted voltage rail signals for analysis by the noise sensing circuit.

14. The integrated circuit of claim 1, further comprising:
a plurality of probe locations along the voltage rail; and
a multiplexer having inputs coupled to the plurality of probe locations, the multiplexer configured to select a particular probe location from the plurality of probe locations as an output;
wherein the output of the multiplexer is coupled to an input of the voltage level shifter.

15. The integrated circuit of claim 1, further comprising:
a first plurality of probe locations along the voltage rail;
a second plurality of probe locations along the second voltage rail;
a first multiplexer having inputs coupled to the first plurality of probe locations, the first multiplexer configured to select a signal from a probe location from the first plurality of probe locations as an output, wherein the output of the first multiplexer is provided as an input to the voltage level shifter;
a second multiplexer having inputs coupled to the second plurality of probe locations, the second multiplexer configured to select a signal from a probe location from the second plurality of probe locations as an output; and
a third multiplexer having inputs coupled to an output of the voltage level shifter and the output of the second multiplexer, the third multiplexer having an output coupled to an input of the noise sensing circuit.

16. The integrated circuit of claim 15, further comprising a control circuit configured to independently control selection lines coupled to the first, second, and third multiplexers for selection of a particular probe location.

17. The integrated circuit of claim 15, wherein the probe locations corresponding to the first multiplexer correspond to points along a VSS rail, wherein the probe locations corresponding to the second multiplexer correspond to points along a VDD rail, further comprising a control circuit configured to control the first and second multiplexers such that at least a portion of the control lines are identical or are inverses or each other, and configured to control the third multiplexer to select between the VSS rail or the VDD rail.

18. The integrated circuit of claim 1, further comprising:
a first plurality of probe locations along the voltage rail;
a second plurality of probe locations along the second voltage rail, wherein the second voltage rail is different from the voltage rail;
a plurality of voltage level shifters including the voltage level shifter, wherein inputs of the plurality of voltage level shifters are operatively coupled to the first plurality of probe locations;
a first multiplexer having inputs coupled to outputs of the plurality of voltage level shifters, the first multiplexer configured to select a signal from an output of a voltage level shifter of the plurality of voltage level shifters as an output;
a second multiplexer having inputs coupled to the second plurality of probe locations, the second multiplexer configured to select a signal from a probe location from the second plurality of probe locations as an output; and
a third multiplexer having inputs coupled to the output of the first multiplexer and the output of the second multiplexer, the third multiplexer having an output coupled to an input of the noise sensing circuit.

19. The integrated circuit of claim 18, further comprising a control circuit configured to independently control selection lines coupled to the first, second, and third multiplexers for selection of a particular probe location.

20. The integrated circuit of claim 18, wherein the probe locations corresponding to the first multiplexer correspond to points along a VSS rail, wherein the probe locations corresponding to the second multiplexer correspond to points along a VDD rail, further comprising a control circuit configured to control the first and second multiplexers such that at least a portion of the control lines are identical to each other or are inverses of each other, and configured to control the third multiplexer to select between the VSS rail or the VDD rail.

21. The integrated circuit of claim 1, further comprising a passgate transistor disposed in a signal path between a source of the voltage rail signal and the noise sensing circuit.

22. The integrated circuit of claim 1, wherein at least one of the noise sensing circuit or the voltage level shifter is configured to be enabled or disabled to save power.

23. The integrated circuit of claim 22, wherein the noise sensing circuit and the voltage level shifter are enabled or disabled with a single control.

24. The integrated circuit of claim 22, wherein the noise sensing circuit and the voltage level shifter are enabled or disabled with independent controls.

25. The integrated circuit of claim 1, wherein the voltage level shifter generates a level-shifted voltage rail signal, and wherein the noise sensing circuit is configured to generate a count associated with a sampled voltage level of the level-shifted voltage rail signal as a measure of noise.

26. The integrated circuit of claim 25, wherein the noise sensing circuit further comprises:
a voltage sampling circuit comprising a sampling switch and a sampling capacitor;
an amplifier configured to buffer a voltage stored on the sampling capacitor;
a ring oscillator configured to oscillate at a frequency that varies with the voltage stored on the sampling capacitor; and
a counter configured to count oscillations of the ring oscillator.

27. A method of sensing noise on a voltage rail of an integrated circuit (IC), the method comprising:
   voltage level shifting a DC component of a voltage rail signal from a first voltage level to a second voltage level to generate a level-shifted voltage rail signal, wherein a probe location along the voltage rail comprises a source for the voltage rail signal; and
   sensing noise present on the level-shifted voltage rail signal using a noise sensing circuit, wherein the first voltage level is outside an input voltage operating range of the noise sensing circuit, and wherein the second voltage level is within the input voltage operating range.

28. The method of claim 27, further comprising coupling the probe location to the voltage signal measurement circuit via a multiplexer.

29. The method of claim 27, wherein voltage level shifting the voltage rail signal comprises AC coupling a ground rail signal.

30. The method of claim 27, further comprising performing voltage level shifting within the IC.

31. The method of claim 27, wherein voltage level shifting comprises using a source follower to level shift the voltage rail signal.

32. The method of claim 31, further comprising bypassing a portion of the source follower with a bypass capacitor.

33. The method of claim 27, wherein voltage level shifting comprises using a level-setting device.

34. The method of claim 27, wherein voltage level shifting the voltage rail signal comprises AC coupling the voltage rail signal with a coupling capacitor.

35. The method of claim 27, wherein voltage level shifting the voltage rail signal comprises AC coupling the voltage rail signal with a memory cell of a DRAM array.

36. The method of claim 27, further comprising:
   wherein voltage level shifting comprises voltage level shifting a plurality of voltage rail signals; and
   selecting, with a multiplexer, a particular level-shifted voltage rail signal from the plurality of level-shifted voltage rail signals for analysis by the noise sensing circuit.

37. The method of claim 27, wherein a plurality of probe locations along the voltage rail are coupled to inputs of a multiplexer, the method further comprising:
   selecting, with the multiplexer, a particular probe location from the plurality of probe locations as a source for the voltage rail signal for voltage level shifting.

38. The method of claim 27, wherein a first plurality of probe locations along the voltage rail are coupled to inputs of a first multiplexer and a second plurality of probe locations along a second voltage rail are coupled to inputs of a second multiplexer, the method further comprising:
   selecting, with the first multiplexer, a probe location from the first plurality of probe locations as an output of the first multiplexer, wherein the output of the first multiplexer is coupled to an input to the voltage level shifter, and wherein an output of the voltage level shifter is coupled to a first input of a third multiplexer;
   selecting, with the second multiplexer, a probe location from the second plurality of probe locations as an output of the second multiplexer, wherein the output of the second multiplexer is coupled to a second input of the third multiplexer; and
   selecting, with the third multiplexer, between at least the output of the voltage level shifter and the output of the second multiplexer as an output of the third multiplexer, wherein the output of the third multiplexer is coupled to an input of the noise sensing circuit.

39. The method of claim 38, further comprising independently controlling selection lines coupled to the first, second, and third multiplexers for selection of a particular probe location.

40. The method of claim 38, wherein the probe locations corresponding to the first multiplexer correspond to points along a VSS rail, wherein the probe locations corresponding to the second multiplexer correspond to points along a VDD rail, further comprising controlling the first and second multiplexers such that at least a portion of the control lines are identical to each other or are inverses of each other, and controlling the third multiplexer to select between the VSS rail or the VDD rail.

41. The method of claim 27, wherein the integrated circuit further comprises a first plurality of probe locations along the voltage rail and a second plurality of probe locations along a second voltage rail, the method further comprising:
   voltage level shifting each voltage rail signal of the first plurality of probe locations along the voltage rail to generate a plurality of level-shifted voltage rail signals;
   selecting, with the first multiplexer, from among the plurality of level-shifted voltage rail signals as an output of the first multiplexer, wherein the output of the first multiplexer is coupled to an input to the voltage level shifter, and wherein an output of the voltage level shifter is coupled to a first input of a third multiplexer;
   selecting, with the second multiplexer, a probe location from the second plurality of probe locations as an output of the second multiplexer, wherein the output of the second multiplexer is coupled to a second input of the third multiplexer; and
   selecting, with the third multiplexer, between at least the output of first multiplexer and the output of the second multiplexer as an output of the third multiplexer, wherein the output of the third multiplexer is coupled to an input of the noise sensing circuit.

42. The method of claim 27, further comprising activating a passgate transistor when noise on the level-shifted voltage rail signal is to be sensed, and deactivating the passgate transistor at other times, wherein the passgate transistor is in a signal path between the source for the voltage rail signal and the noise sensing circuit.

43. The method of claim 42, further comprising independently controlling selection lines coupled to the first, second, and third multiplexers for selection of a particular probe location.

44. The method of claim 42, wherein the probe locations corresponding to the first multiplexer correspond to points along a VSS rail, wherein the probe locations corresponding to the second multiplexer correspond to points along a VDD rail, further comprising controlling the first and second multiplexers such that at least a portion of the control lines are identical to each other or are inverses or each other, and controlling the third multiplexer to select between the VSS rail or the VDD rail.

45. The method of claim 27, further comprising controllably enabling or disabling at least one of level shifting or sensing noise to save power.

46. The method of claim 45, further comprising controllably enabling or disabling level shifting and sensing noise with a single control.

47. The method of claim 45, further comprising controllably enabling or disabling level shifting and sensing noise with independent controls.

48. The method of claim 27, further comprising generating a count associated with a sampled voltage level of the level-shifted voltage rail signal as a measure of noise.

49. The method of claim 48, further comprising:
voltage sampling the level-shifted voltage rail signal on a sampling capacitor;
buffering a voltage stored on the sampling capacitor;
generating an oscillating signal that oscillates at a frequency that varies with the voltage stored on the sampling capacitor; and
counting oscillations of the oscillating signal.

\* \* \* \* \*

UNITED STATES PATENT AND TRADEMARK OFFICE
CERTIFICATE OF CORRECTION

PATENT NO. : 8,953,364 B2
APPLICATION NO. : 13/622016
DATED : February 10, 2015
INVENTOR(S) : Hollis Page 1 of 1

It is certified that error appears in the above-identified patent and that said Letters Patent is hereby corrected as shown below:

In the Claims

Column 14, line 1, Claim 17, delete "or each" and insert -- of each --, therefor.

Column 16, line 53, Claim 44, delete "or each" and insert -- of each --, therefor.

Signed and Sealed this
Twelfth Day of May, 2015

Michelle K. Lee
*Director of the United States Patent and Trademark Office*